(12) United States Patent
Cho et al.

(10) Patent No.: US 11,923,214 B2
(45) Date of Patent: Mar. 5, 2024

(54) SEMICONDUCTOR PACKAGING APPARATUS AND METHOD OF MANUFACTURING SEMICONDUCTOR DEVICE USING THE SAME

(71) Applicant: SAMSUNG ELECTRONICS CO., LTD., Suwon-si (KR)

(72) Inventors: Junghyun Cho, Hwaseong-si (KR); Sang-Geun Park, Hwaseong-si (KR); Dongseok Baek, Hwaseong-si (KR); Jaehyuk Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 341 days.

(21) Appl. No.: 17/337,709

(22) Filed: Jun. 3, 2021

(65) Prior Publication Data

US 2021/0366743 A1    Nov. 25, 2021

Related U.S. Application Data

(62) Division of application No. 16/149,771, filed on Oct. 2, 2018, now Pat. No. 11,062,924.

(30) Foreign Application Priority Data

Dec. 21, 2017  (KR) ........................ 10-2017-0177168

(51) Int. Cl.
*H01L 21/67* (2006.01)
*H01L 21/66* (2006.01)
*H01L 21/683* (2006.01)

(Continued)

(52) U.S. Cl.
CPC .. *H01L 21/67132* (2013.01); *H01L 21/67092* (2013.01); *H01L 21/67103* (2013.01);
(Continued)

(58) Field of Classification Search
CPC ......... H01L 21/67132; H01L 21/67092; H01L 21/67103; H01L 21/67109;
(Continued)

(56) References Cited

U.S. PATENT DOCUMENTS 7,598,523 B2 * 10/2009 Luo .................... H01L 25/0657
257/E23.011
7,842,548 B2 * 11/2010 Lee .................... H01L 21/67184
438/459

(Continued)

FOREIGN PATENT DOCUMENTS

JP      2011-151073      8/2011
JP      2011-181755      9/2011
(Continued)

*Primary Examiner* — Vu A Vu
(74) *Attorney, Agent, or Firm* — F. Chau & Associates, LLC

(57) ABSTRACT

A semiconductor packaging apparatus and methods of manufacturing semiconductor devices using the same. The semiconductor packaging apparatus includes a process unit, and a controller associated with the process unit. The process unit includes a bonding part that bonds a semiconductor substrate and a carrier substrate to each other to form a bonded substrate, a cooling part that cools the bonded substrate, and a detection part in the cooling part and configured to detect a defect of the bonded substrate. The controller is configured to control the process unit using data obtained from the detection part.

8 Claims, 12 Drawing Sheets

(51) Int. Cl.
*H01L 23/31* (2006.01)
*H01L 23/48* (2006.01)
*H01L 21/56* (2006.01)
*H01L 23/00* (2006.01)

(52) U.S. Cl.
CPC .. *H01L 21/67109* (2013.01); *H01L 21/67259* (2013.01); *H01L 21/67288* (2013.01); *H01L 21/6835* (2013.01); *H01L 22/12* (2013.01); *H01L 23/3121* (2013.01); *H01L 23/481* (2013.01); *H01L 21/56* (2013.01); *H01L 24/13* (2013.01); *H01L 24/94* (2013.01); *H01L 2221/68327* (2013.01); *H01L 2221/6834* (2013.01); *H01L 2221/68395* (2013.01); *H01L 2224/13023* (2013.01); *H01L 2224/13025* (2013.01)

(58) Field of Classification Search
CPC ......... H01L 21/67259; H01L 21/67288; H01L 21/6835; H01L 22/12; H01L 23/3121; H01L 23/481; H01L 21/56; H01L 24/13; H01L 24/94; H01L 2221/68327; H01L 2221/6834; H01L 2221/68395; H01L 2224/13023; H01L 2224/13025; H01L 21/76898; H01L 2224/0557; H01L 2224/13111; H01L 2224/13139; H01L 24/03; H01L 24/11; H01L 2224/03002; H01L 2224/13147; H01L 2224/16146; H01L 2224/16148; H01L 2224/16227; H01L 2224/17181; H01L 2224/94; H01L 21/67121; H01L 21/67098; H01L 21/67242; H01L 21/682
USPC .......................................................... 438/15
See application file for complete search history.

(56) References Cited

U.S. PATENT DOCUMENTS

| | | | |
|---|---|---|---|
| 7,897,511 B2 * | 3/2011 | Lee | H01L 21/76898 257/E23.174 |
| 7,988,803 B2 | 8/2011 | Takasaki et al. | |
| 8,021,795 B2 * | 9/2011 | Qi | H01M 8/0282 429/479 |
| 8,124,429 B2 * | 2/2012 | Norman | H05K 1/029 257/E23.079 |
| 8,178,972 B2 * | 5/2012 | Yutani | H01L 24/12 438/460 |
| 8,513,061 B2 * | 8/2013 | Lee | H01L 21/76898 438/678 |
| 8,819,923 B2 * | 9/2014 | Nishibayashi | H01L 21/67092 29/721 |
| 8,866,281 B2 * | 10/2014 | Huang | H01L 25/0652 257/737 |
| 9,007,456 B2 | 4/2015 | Gastaldo et al. | |
| 9,123,754 B2 * | 9/2015 | Shih | H01L 23/544 |
| 9,354,047 B2 | 5/2016 | Kannaka et al. | |
| 9,658,281 B2 | 5/2017 | Wang et al. | |
| 10,014,202 B2 | 7/2018 | Thallner | |
| 10,367,324 B2 * | 7/2019 | Taira | H01S 5/0216 |
| 10,634,631 B2 * | 4/2020 | Sandiford | H05B 3/20 |
| 2002/0000029 A1 | 1/2002 | Emoto | |
| 2010/0033706 A1 | 2/2010 | Shindo | |
| 2012/0291267 A1 | 11/2012 | Nishibayashi et al. | |
| 2014/0158303 A1 | 6/2014 | Hirakawa et al. | |
| 2015/0364432 A1 | 12/2015 | Chung et al. | |
| 2016/0300747 A1 | 10/2016 | George et al. | |
| 2019/0198366 A1 | 6/2019 | Cho et al. | |

FOREIGN PATENT DOCUMENTS

| | | |
|---|---|---|
| JP | 2011-222633 | 11/2011 |
| JP | 2012-138423 | 7/2012 |
| JP | 2014-017455 | 1/2014 |
| JP | 2015-040698 | 3/2015 |
| JP | 5895332 | 3/2016 |
| KR | 10-1193361 | 10/2012 |
| KR | 10-2014-0051243 | 4/2014 |
| KR | 10-1445123 | 10/2014 |
| KR | 10-2015-0023376 | 3/2015 |
| KR | 10-2015-0144178 | 12/2015 |

* cited by examiner

Ced by reference herein.

SEMICONDUCTOR PACKAGING APPARATUS AND METHOD OF MANUFACTURING SEMICONDUCTOR DEVICE USING THE SAME

CROSS-REFERENCE TO RELATED APPLICATIONS

This application is a divisional of U.S. patent application Ser. No. 16/149,771, filed Oct. 2, 2018 in the U.S. Patent and Trademark Office, which claims priority under 35 U.S.C § 119 from Korean Patent Application No. 10-2017-0177168 filed on Dec. 21, 2017, in the Korean Intellectual Property Office, the entire contents of which are incorporated by reference herein.

1. TECHNICAL FIELD

Embodiments of the inventive concept relate to a semiconductor packaging apparatus for performing a bonding process in which a semiconductor substrate and a carrier substrate are bonded to each other. More particularly, embodiments of the inventive concept relate to a semiconductor packaging apparatus that detects a defect of a bonded substrate and a method of manufacturing a semiconductor device using the same.

2. DISCUSSION OF THE RELATED ART

Semiconductor packaging technology has been developed to employ "through electrodes" which are used to electrically connect a semiconductor device to other semiconductor devices or a printed circuit board (PCB). The through electrodes may be used to mount semiconductor devices three-dimensionally, and may achieve a high-speed transfer rate greater than solder balls or solder bumps. The semiconductor packaging technology using the through electrodes may include a back-grinding process to thin a semiconductor substrate (such as a silicon wafer), and a bonding process in which the semiconductor substrate is bonded to a carrier substrate that supports the semiconductor substrate during the back-grinding process. Misalignment between the semiconductor substrate and the carrier substrate may occur when the bonding process is performed.

SUMMARY

Some embodiments of the inventive concept provide a semiconductor packaging apparatus having a function to detect a defect of a bonded substrate.

Some embodiments of the inventive concept provide a method of manufacturing a semiconductor device capable of minimizing the occurrence of a defect in a bonded substrate.

According to embodiments of inventive concept, a semiconductor packaging apparatus may include: a process unit including a bonding part that bonds a semiconductor substrate and a carrier substrate to each other to form a bonded substrate; a cooling part that cools the bonded substrate; and a detection part arranged in the cooling part that is configured to detect a whether the bonded substrate has a defect; and a controller connected to the process unit, the controller is configured to control the process unit using data obtained from the detection part; and the defect detected by the detection part includes at least one of a surface defect of the bonded substrate or a defect in the bonding of the semiconductor substrate and the carrier substrate.

According to some embodiments of the inventive concept, a semiconductor packaging apparatus may include: a bonding part that bonds a semiconductor substrate and a carrier substrate to each other to form a bonded substrate; a cooling part that performs a cooling process to cool the bonded semiconductor substrate and carrier substrate; and a detection part in the cooling part and configured to detect a defect of the bonded semiconductor substrate and carrier substrate while the cooling process is performed.

According to some embodiments of the inventive concept, a method of manufacturing a semiconductor device may include: forming a bonded substrate by bonding a carrier substrate to a semiconductor substrate in a bonding part of a semiconductor packaging apparatus; performing a cooling process that cools the bonded substrate; and detecting a defect of the bonded substrate during the cooling process.

BRIEF DESCRIPTION OF THE DRAWINGS

FIGS. 6 to 10 and 13 to 16 illustrate cross-sectional views showing a method of manufacturing a semiconductor device, according to embodiments of the inventive concept, in which:

FIG. 6 illustrates a cross-sectional view of an arrangement of bumps respectively connected to vias in which a release layer is arranged over the surface of the bumps and the first surface of a circuit layer;

FIG. 7 illustrates a cross-sectional view according to an embodiment of the inventive concept in which the arrangement of FIG. 6 has an adhesive layer arranged on the release layer;

FIG. 8 illustrates a cross-sectional view according to an embodiment of the inventive concept showing a carrier substrate and a semiconductor forming the bonded substrate;

FIG. 9 illustrates a cross-sectional view showing of a heating process being applied to the bonded substrate according to an embodiment of the inventive concept;

FIG. 10 illustrates a cross-sectional view a cooling process being applied to the bonded substrate according to an embodiment of the inventive concept;

DETAILED DESCRIPTION OF EMBODIMENTS

Some embodiments of the inventive concept will be hereinafter described below in detail with reference to the accompanying drawings to aid in clearly explaining the inventive concept.

Figure 1:
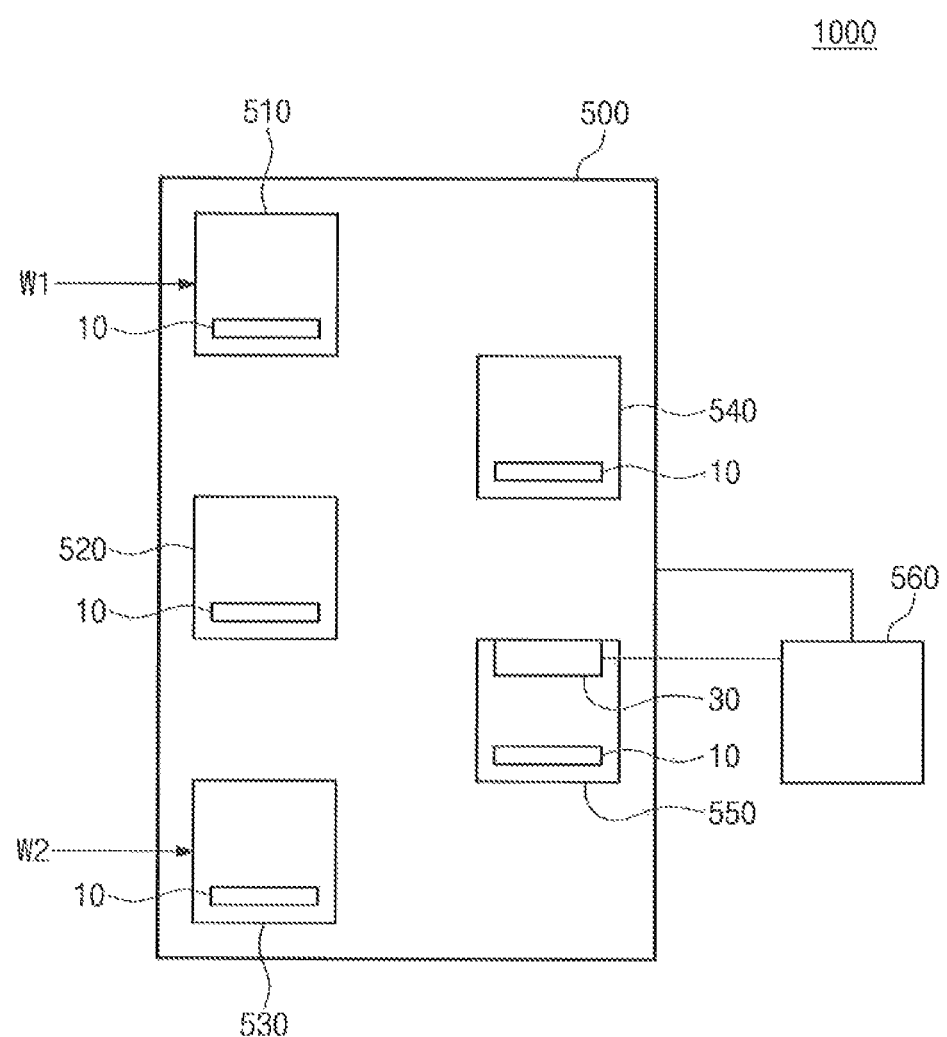
FIG. 1 illustrates a simplified schematic diagram showing a semiconductor packaging apparatus according to embodiments of inventive concept.
Figure 2:
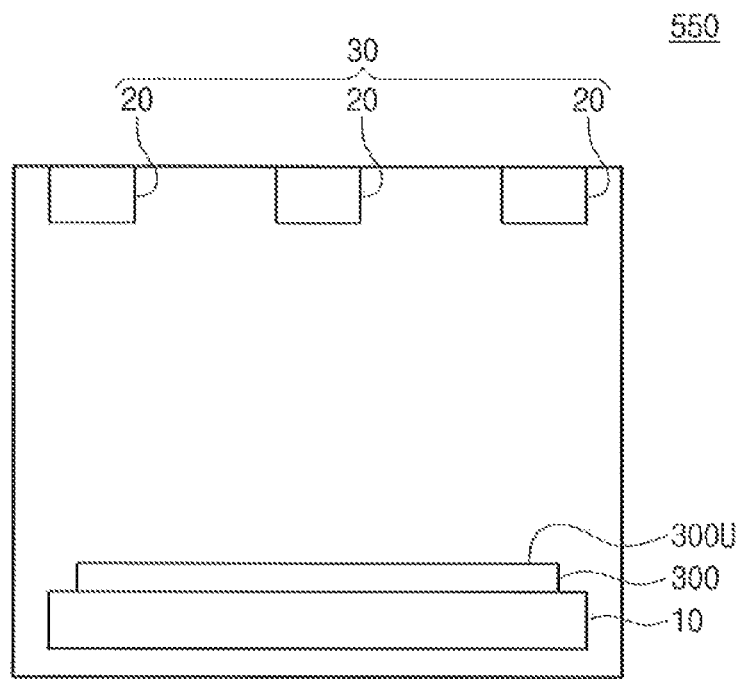
FIG. 2 illustrates a simplified cross-sectional view showing a cooling part of FIG. 1.

FIG. 1 illustrates a simplified schematic diagram showing a semiconductor packaging apparatus according to embodiments of the inventive concept. FIG. 2 illustrates a simplified cross-sectional view showing a cooling part of FIG. 1.

Figure 3:
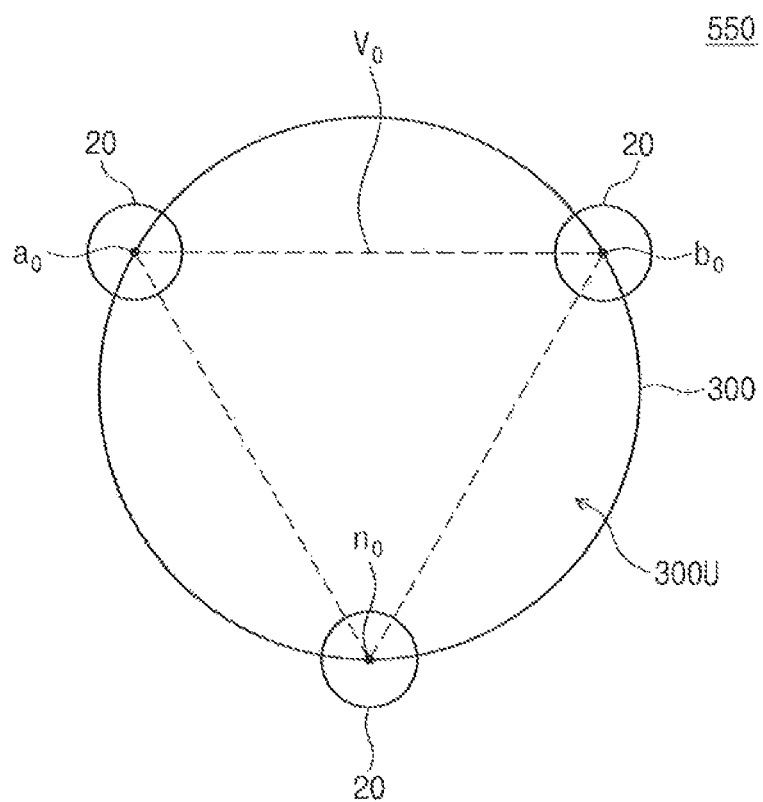
FIG. 3 illustrates a plan view showing an arrangement of image measurement components of FIG. 2.

FIG. 3 illustrates a plan view showing an arrangement of image measurement components of FIG. 2.

Referring now to FIG. 1, a semiconductor packaging apparatus 1000 may include a process unit 500 and a controller 560 associated with the process unit 500. The process unit 500 may be configured to perform a bonding operation in which a carrier substrate is bonded to a semiconductor substrate. The process unit 500 has various parts (e.g., stations) that perform respective operations. For example, the process unit 500 may include a first coating part 510 that forms a release layer on the semiconductor substrate, a second coating part 520 that forms an adhesive layer on the semiconductor substrate, a bonding part 530 that bonds the carrier substrate and the semiconductor substrate to each other to form a bonded substrate, a heating part 540 that heats the bonded substrate, and a cooling part 550 that cools the heated bonded substrate. The first coating part 510, the second coating part 520, the bonding part 530, the heating part 540, and the cooling part 550 may all be provided in the single process unit 500. Each of the first coating part 510, the second coating part 520, the bonding part 530, the heating part 540, and the cooling part 550 may include a stage 10 that loads thereon the semiconductor substrate, the carrier substrate, or the bonded substrate, in accordance with an operation performed by a particular part of the process unit 500 during the packaging process.

The process unit 500 may further include a detection part 30 provided in the cooling part 550. The detection part 30 may be provided above the stage 10 of the cooling part 550, and is configured to detect a defect in the bonded substrate loaded on the stage 10 of the cooling part 550. For example, the bonded substrate may be checked to be within certain tolerances, as the placement of the semiconductor substrate and the carrier substrate relative to each other to form of the bonded substrate may be identified as a defect when, for example, based on image measurements of the bonded substrate.

Referring to FIGS. 2 and 3, the detection part 30 may be configured to measure edge images of a bonded substrate 300 to determine whether there is a defect. The detection part 30 may include a plurality of image measurement components 20 provided in the cooling part 550. The image measurement components 20 may be, or may include, for example, a plurality of cameras or sensors. The embodiments of the inventive concept are not limited to having one particular type of image measurement components 20, for example, some may be cameras, and others may be sensors. Each of the image measurement components 20 may be substantially perpendicularly spaced apart from the stage 10 of the cooling part 550. The image measurement components 20 may be horizontally spaced apart from each other. It is also within the embodiments of the inventive concept that there may be an arrangement of the image measurement components 20 horizontally spaced into rows. The image measurement components 20 may be configured to measure corresponding edge images of the bonded substrate 300 loaded on the stage 10.

With reference to FIG. 3, the edge images obtained by the image measurement components 20 may be images including corresponding edge points $n_0$, $a_0$, and $b_0$ on an upper surface 300U of the bonded substrate 300. When viewed in plan, the edge points $n_0$, $a_0$, and $b_0$ may correspond to vertices of an imaginary regular triangle $V_0$ provided on the upper surface 300U of the bonded substrate 300. One $n_0$ of the edge points $n_0$, $a_0$, and $b_0$ may correspond to a notch of the bonded substrate 300. The image measurement components 20 may be arranged to measure the edge images respectively including the edge points $n_0$, $a_0$, and $b_0$ of the bonded substrate 300. When the bonded substrate 300 includes a defect therein, at least one of the edge images may include an image of the defect included in the bonded substrate 300.

Although FIG. 3 shows three image measurement components 20 are illustrated, a person of ordinary skill in the art should appreciate that embodiments of the inventive concept are not limited thereto. For example, the cooling part 550 may further include therein additional image measurement components 20 that correspondingly measure additional edge images of the bonded substrate 300. It is also within embodiments of the inventive concept that there may be fewer image measurement components 20.

Referring back to FIG. 1, the controller 560 may be electrically connected to the detection part 30 and configured to process and store a variety of data. The controller 560 may be configured to control the process unit 500 using data obtained from the detection part 30.

A method of manufacturing a semiconductor device using the semiconductor packaging apparatus 1000 according to an embodiment of the inventive concept will now be disclosed.

Figure 4:
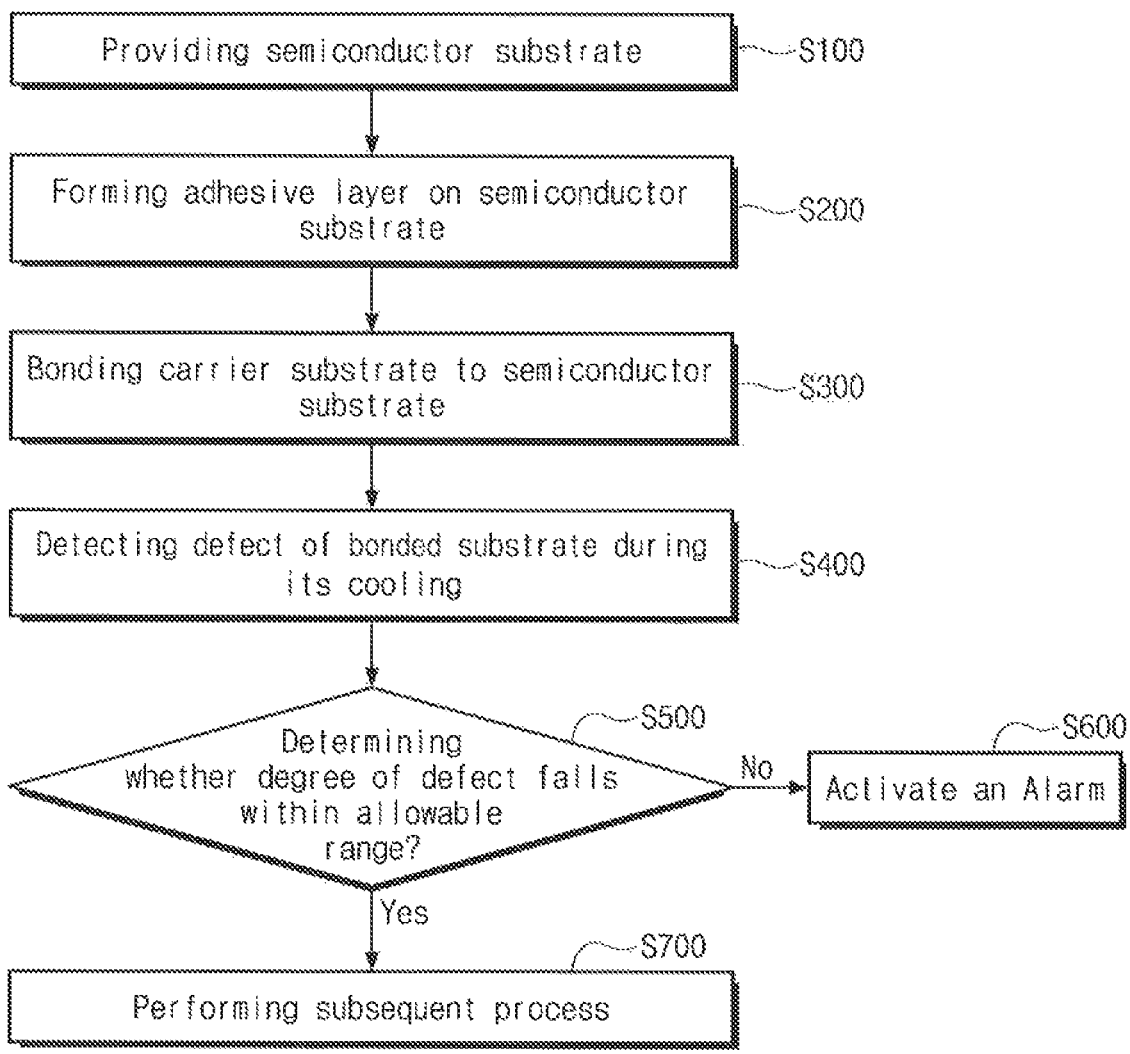
FIG. 4 illustrates a flowchart showing a method of manufacturing a semiconductor device, according to embodiments of the inventive concept.
Figure 5:
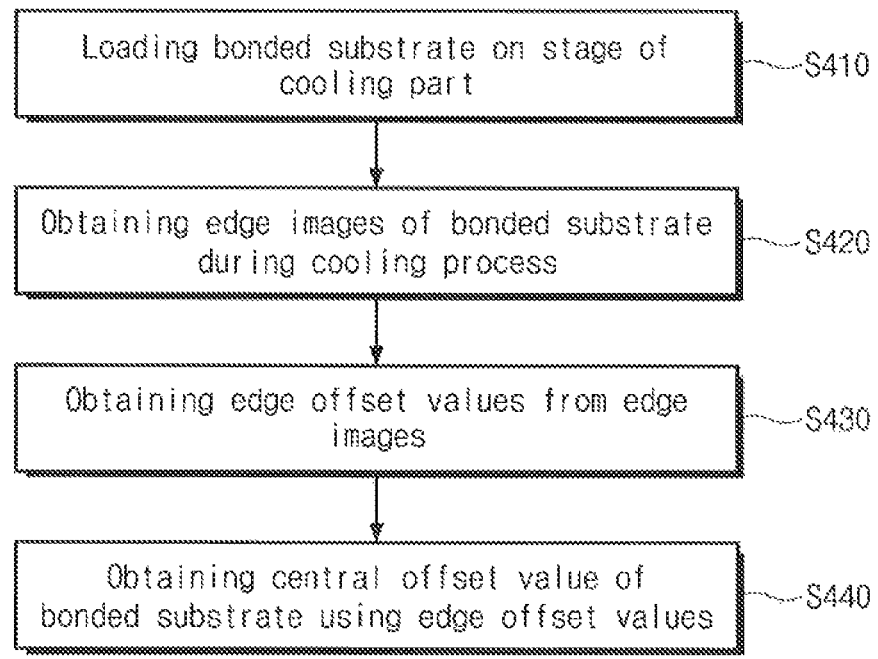
FIG. 5 illustrates a flowchart showing in detail an example of operation S400 in FIG. 4.
Figure 11:
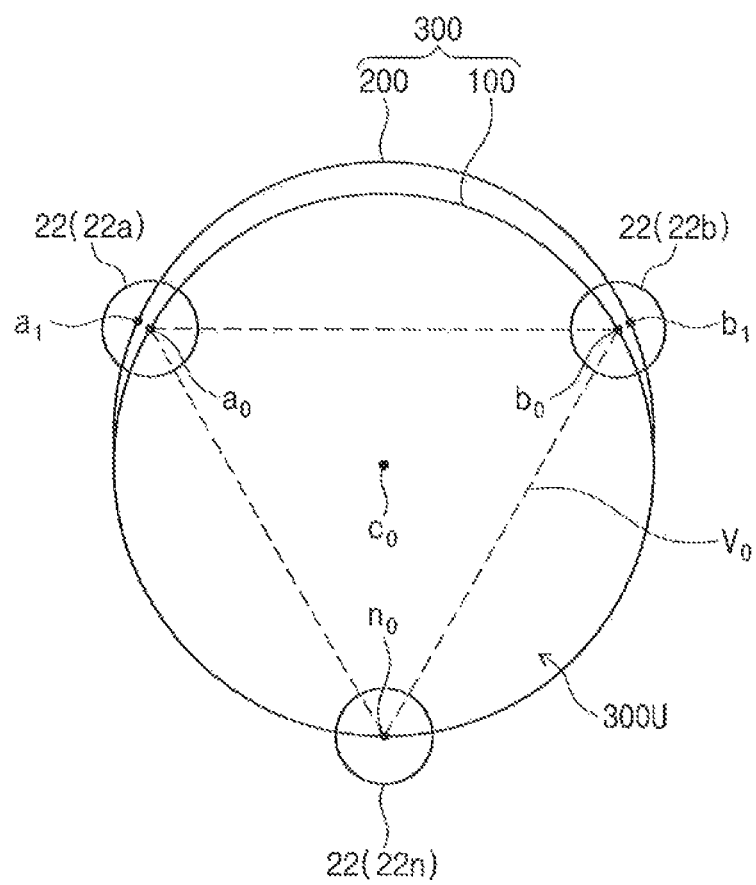
FIGS. 11 and 12 illustrate conceptual views showing an operation S400 in FIG. 4.
Figure 12:
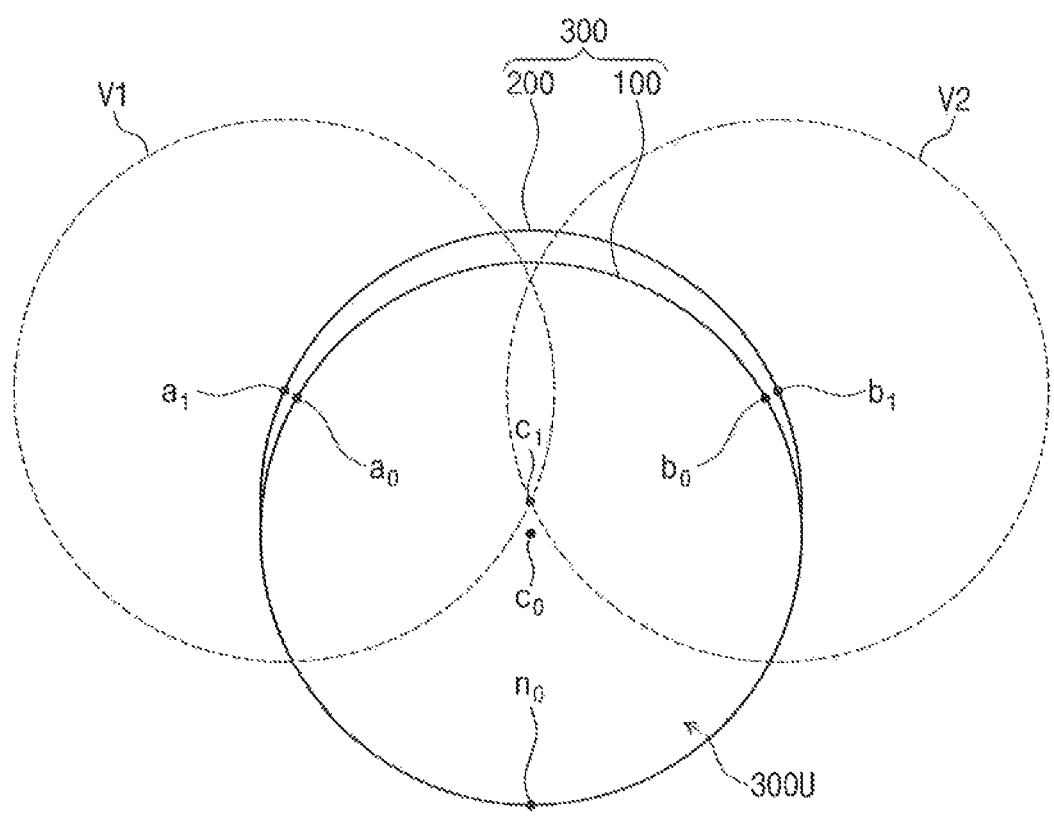

FIG. 4 illustrates a flowchart showing a method of manufacturing a semiconductor device, according to embodiments of the inventive concept. FIG. 5 illustrates a flowchart showing in detail operation S400 in FIG. 4. FIGS. 6 to 10 and 13 to 16 illustrate cross-sectional views showing a method of manufacturing a semiconductor device, according to embodiments of the inventive concept. FIGS. 11 and 12 illustrate conceptual views showing the operation S400 in FIG. 4.

Figure 6:
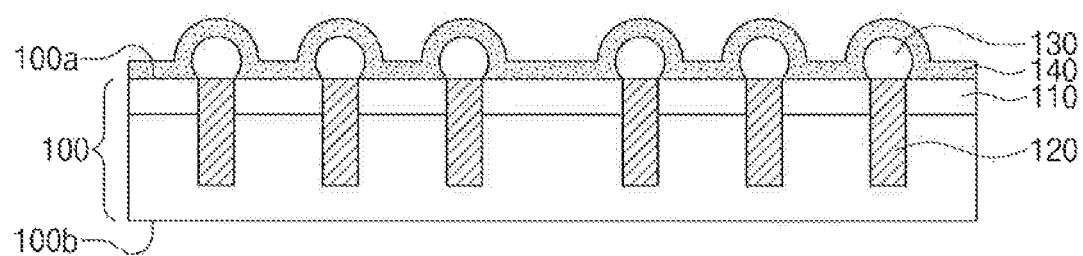

Referring to FIGS. 4 and 6, at operation (S100), a semiconductor substrate 100 may be provided. The semiconductor substrate 100 may be a wafer-level substrate. The semiconductor substrate 100 may include silicon or germanium. The semiconductor substrate 100 may have a first surface 100a and a second surface 100b opposing each other. The semiconductor substrate 100 may include a circuit layer 110 provided adjacent to the first surface 100a. The circuit layer 110 may include an integrated circuit (e.g., a memory circuit, a logic circuit, or a combination thereof). The semiconductor substrate 100 may include a plurality of through vias 120 penetrating the semiconductor substrate 100 and bumps 130 connected to the corresponding through vias 120. Each of the through vias 120 may extend from the first surface 100a of the semiconductor substrate 100 toward an inside of the semiconductor substrate 100, and may be spaced apart from the second surface 100b of the semiconductor substrate 100. The through vias 120 may be electrically connected to the integrated circuit of the circuit layer 110. The through vias 120 may be constructed of a conductive material. The bumps 130 may be constructed of tin, silver, copper, or an alloy thereof. Although not shown, a pad may be interposed between each of the through vias 120 and each of the bumps 130. The pad may include metal, such as copper or aluminum.

The semiconductor substrate 100 may be provided in the process unit 500 of the semiconductor packaging apparatus 1000 of FIG. 1 (W1 of FIG. 1). The semiconductor substrate 100 may be loaded on the stage 10 of the first coating part 510, and a release layer 140 may be formed on the first surface 100a of the semiconductor substrate 100 (see FIG. 6). The release layer 140 may include a thermosetting material. For example, the release layer 140 may include a material formed using polydimethylsiloxane (PDMS) as a precursor.

Figure 7:
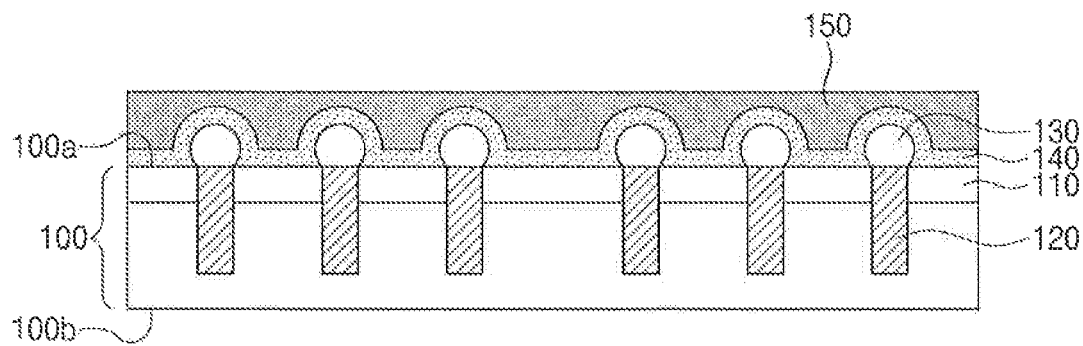

Referring to FIGS. 4 and 7, at operation (S200), after the release layer 140 is formed, an adhesive layer 150 may be formed on the semiconductor substrate 100. For example, the semiconductor substrate 100 on which the release layer 140 is formed may be loaded on the stage 10 of the second coating part 520 of FIG. 1. At the second coating part 520, the adhesive layer 150 may be formed on the first surface 100a of the semiconductor substrate 100, and the release layer 140 may be interposed between the adhesive layer 150 and the first surface 100a of the semiconductor substrate 100. The adhesive layer 150 may include a thermosetting material. For example, the adhesive layer 150 may include an insulating resin.

Figure 8:
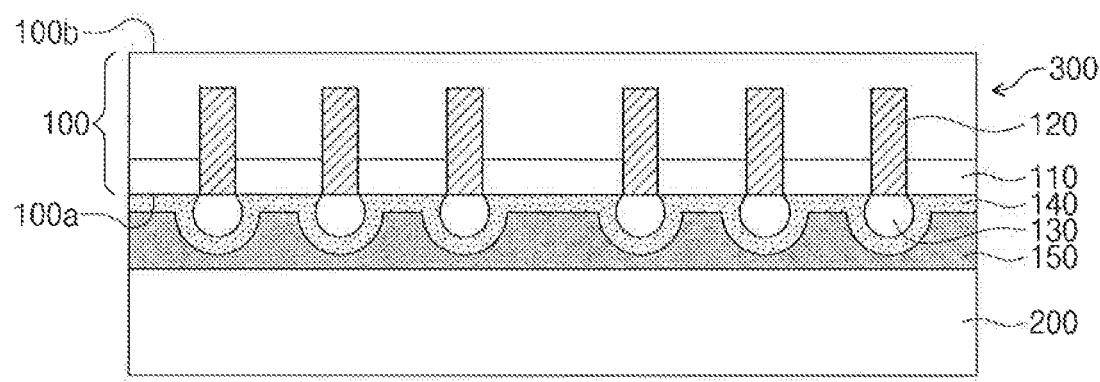
Figure 9:
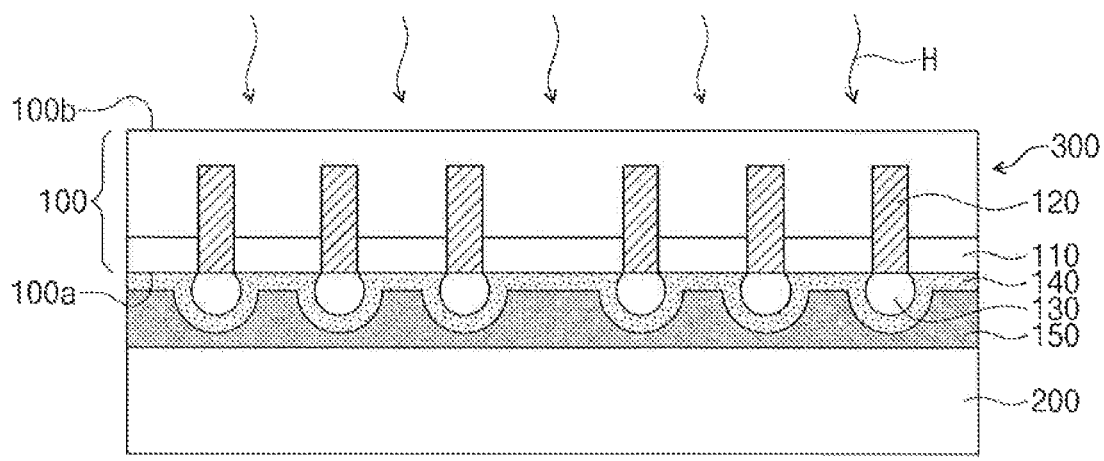

Referring to FIGS. 4, 8, and 9, at operation (S300), a carrier substrate 200 may be bonded to the semiconductor substrate 100. For example, the carrier substrate 200 may be provided in the process unit 500 of the semiconductor packaging apparatus 1000 of FIG. 1 (W2 of FIG. 1). The carrier substrate 200 may be a wafer-level substrate whose size (e.g., diameter) is the same as or similar to that of the semiconductor substrate 100. The carrier substrate 200 may be a silicon substrate or a transparent substrate (e.g., glass substrate). The carrier substrate 200 may be loaded on the stage 10 of the bonding part 530 of FIG. 1.

The bonding part 530 may be provided therein with the semiconductor substrate 100 on which the release layer 140 and the adhesive layer 150 have been formed. The semiconductor substrate 100 may be provided in such a way that the first surface 100a faces the carrier substrate 200. The carrier substrate 200 may be bonded through the release layer 140 and the adhesive layer 150 to the first surface 100a of the semiconductor substrate 100. As a result, a bonded substrate 300 may be formed to include the semiconductor substrate 100 and the carrier substrate 200 that are bonded to each other.

The bonded substrate 300 may be loaded on the stage 10 of the heating part 540 of FIG. 1. The bonded substrate 300 may be provided with heat H (see FIG. 9) to heat the bonded substrate 300. The release layer 140 and the adhesive layer 150 may therefore be hardened by the heating part to increase an adhesion between the semiconductor substrate 100 and the carrier substrate 200.

Figure 10:
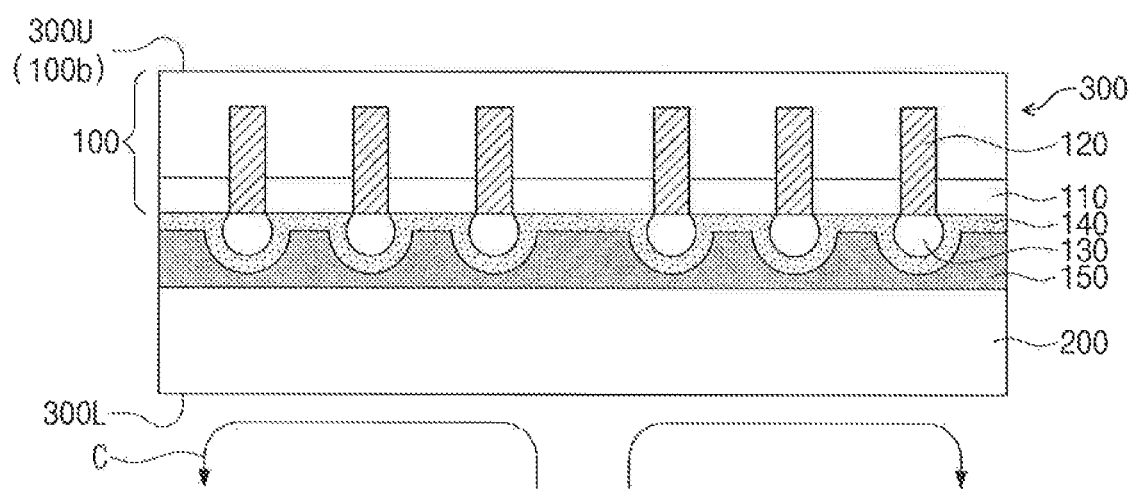

Referring to FIGS. 4 and 10, at operation (S400), while or after the heated bonded substrate 300 is cooled down, the bonded substrate 300 may be examined for defects. For example, the detection part 30 may detect a defect of the bonded substrate 300. For example, the defect of the bonded substrate 300 may be misalignment between the semiconductor substrate 100 and the carrier substrate 200. Alternatively, the defect of the bonded substrate 300 may be surface defects (e.g., extraneous particles) of the bonded substrate 300. Detecting the defect of the bonded substrate 300 may be performed by the detection part 30 and the controller 560 of FIG. 1. The detecting the defect may include obtaining a degree of the defect.

For example, at operation (S410) and referring to FIGS. 5 and 10, the heated bonded substrate 300 may be first loaded on the stage 10 of the cooling part 550 of FIG. 1. The bonded substrate 300 may be disposed between the stage 10 and the detection part 30 shown in FIG. 1. The upper surface 300U of the bonded substrate 300 may be adjacent to the detection part 30, and a bottom surface 300L of the bonded substrate 300 may be adjacent to the stage 10. The upper surface 300U of the bonded substrate 300 may correspond to, for example, the second surface 100b of the semiconductor substrate 100. Thereafter, a cooling process C may be performed to cool down the heated bonded substrate 300.

Referring to FIGS. 5 and 11, according to an embodiment of the inventive concept, at operation (S420), while the cooling process C is being performed, the edge images 22 may be obtained from the bonded substrate 300. The edge images 22 may be correspondingly measured by the image measurement components 20 of the detection part 30 that were discussed with reference to FIGS. 2 and 3. The edge images 22 may include, for example, images of the upper surface 300U of the bonded substrate 300, and may correspondingly include the edge points $n_0$, $a_0$, and $b_0$ of the upper surface 300U of the bonded substrate 300. When viewed in plan, the edge points $n_0$, $a_0$, and $b_0$ may correspond to vertices of an imaginary regular triangle $V_0$ provided on the upper surface 300U of the bonded substrate 300. Among the edge images 22, a first edge image 22a may include a first edge point $a_0$ of the edge points $n_0$, $a_0$, and $b_0$, and a second edge image 22b may include a second edge point $b_0$ of the edge points $n_0$, $a_0$, and $b_0$. Among the edge images 22, a third edge image 22n may include a third edge point $n_0$ of the edge points $n_0$, $a_0$, and $b_0$. The third edge point $n_0$ may correspond to a notch of the bonded substrate 300.

When a defect occurs in the bonded substrate 300, at least one of the edge images 22 may include an image of the defect that occurred in the bonded substrate 300. For example, when misalignment occurs between the semiconductor substrate 100 and the carrier substrate 200, at least two of the edge images 22 may include a misalignment image between the semiconductor substrate 100 and the carrier substrate 200. For example, when misalignment occurs between the semiconductor substrate 100 and the carrier substrate 200, each of the first edge image 22a and the second edge image 22b may include the misalignment image between the semiconductor substrate 100 and the carrier substrate 200. In this case, the first edge image 22a may include not only the first edge point $a_0$ but also a first offset edge point $a_1$ that is offset from the first edge point $a_0$. The first offset edge point $a_1$ may be identified as a defect when an amount of the offset is greater than a threshold. In an embodiment of the inventive concept, such a threshold may be a degree of misalignment. In addition, the second edge image 22b may include not only the second edge point $b_0$ but also a second offset edge point $b_1$ that is offset from the second edge point $b_0$. The first edge point $a_0$ and the second edge point $b_0$ may be placed on an edge of the semiconductor substrate 100, and the first offset edge point $a_1$ and the second offset edge point $b_1$ may be placed on an edge of the carrier substrate 200.

The following describes the obtaining a degree of the misalignment between the semiconductor substrate 100 and the carrier substrate 200 according to an embodiment of the inventive concept.

With regard to operation (S430), a plurality of edge offset values may be correspondingly obtained from the edge images 22. The controller 560 of FIG. 1 may be used to obtain the edge offset values. The controller 560 may obtain the edge images 22 from the detection part 30, and correspondingly yield the edge offset values from the obtained edge images 22.

For example, each of the edge points $n_0$, $a_0$, and $b_0$ may have an (x, y) coordinate value on a Cartesian coordinate system whose origin is at a center $C_0$ of the upper surface 300U of the bonded substrate 300. The controller 560 may be provided in advance with the coordinate value of each of the edge points $n_0$, $a_0$, and $b_0$. When each of the first edge image 22a and the second edge image 22b includes the misalignment image, the first offset edge point $a_1$ may be determined on a straight line passing through the first edge point $a_0$ and the center $C_0$ of the upper surface 300U of the bonded substrate 300, and the second offset edge point $b_1$ may be determined on a straight line passing through the second edge point $b_0$ and the center $C_0$ of the upper surface 300U of the bonded substrate 300.

According to an embodiment of the inventive concept, a first edge offset value and a second edge offset value may be correspondingly obtained from the first edge image 22a and the second edge image 22b. The first edge offset value may relate to a relative position of the first offset edge point $a_1$ with respect to the first edge point $a_0$, and may be obtained as an (x, y) coordinate value on a Cartesian coordinate system whose origin is at the first edge point $a_0$. Likewise, the second edge offset value may relate to a relative position of the second offset edge point $b_1$ with respect to the second edge point $b_0$, and may be obtained as an (x, y) coordinate value on a Cartesian coordinate system whose origin is at the second edge point $b_0$. The first edge offset value may indicate the degree of misalignment between the semiconductor substrate 100 and the carrier substrate 200 on a first region of the bonded substrate 300, which is corresponds to the first edge image 22a. In other words, the first edge offset value may correspond to an amount (e.g., a degree) that the edge of the carrier substrate 200 offsets from the edge of the semiconductor substrate 100, on the first region of the bonded substrate 300. The second edge offset value may indicate the degree of misalignment between the semiconductor substrate 100 and the carrier substrate 200 on a second region of the bonded substrate 300, which is corresponds to the second edge image 22b. In other words, the second edge offset value may correspond to the amount (e.g., a degree) that the edge of the carrier substrate 200 offsets from the edge of the semiconductor substrate 100 on the second region of the bonded substrate 300.

Referring to FIGS. 5 and 12, at operation (S440) the edge offset values may be used to obtain a central offset value of the bonded substrate 300. The controller 560 shown in FIG. 1 may be used to obtain the central offset value.

For example, when each of the first edge offset value and the second edge offset value is obtained, there may be produced a first imaginary circle V1 whose center is at the first offset edge point $a_1$, and a second imaginary circle V2 whose center is at the second offset edge point $b_1$. Each of the first imaginary circle V1 and the second imaginary circle V2 may have the same size (e.g., diameter) as that of the semiconductor substrate 100. The first imaginary circle V1 and the second imaginary circle V2 may intersect each other, and as a result, an intersection point $C_1$ of the first and second imaginary circles V1 and V2 may be generated on the upper surface 300U of the bonded substrate 300. The central offset value may relate to a relative position of the intersection point $C_1$ with respect to the center $C_0$ of the upper surface 300U of the bonded substrate 300, and may be obtained as an (x, y) coordinate value on a Cartesian coordinate system whose origin is at the center $C_0$ of the upper surface 300U of the bonded substrate 300. When viewed in a plan view, the central offset value may correspond to an amount that a center of the carrier substrate 200 offsets from a center (e.g., $C_0$) of the semiconductor substrate 100. The central offset value may be determined as the degree of misalignment between the semiconductor substrate 100 and the carrier substrate 200.

Referring back to FIGS. 4 and 10, at operation (S500) the controller 560 of FIG. 1 may determine whether or not a degree of defect of the bonded substrate 300 falls within an allowable range. The controller 560 may be configured to control the process unit 500 of FIG. 1, based on the degree of defect (e.g., the degree of misalignment between the semiconductor substrate 100 and the carrier substrate 200).

At operation (S500), when the degree of defect does not fall within the allowable range, operation (S600) is executed in which the controller 560 may trigger/indicate an alarm informing that the degree of defect is out of the allowable range.

In addition, at operation (S500), when the degree of defect falls within the allowable range, at operation (S700) a subsequent process may be performed on the bonded substrate 300. When the cooling process C is terminated, the bonded substrate 300 may be unloaded from the stage 10 of the cooling part 550 of FIG. 1. After that, the bonded substrate 300 may be transferred outside the process unit 500 of FIG. 1, and then the subsequent process may be performed. The following describes the subsequent process performed on the bonded substrate 300.

Figure 13:
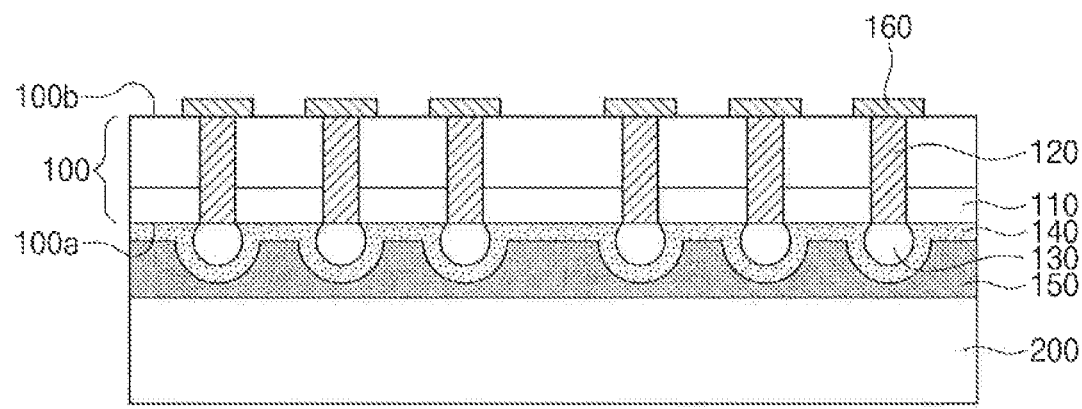

Referring to FIG. 13, the semiconductor substrate 100 may be partially removed, thereby being thinned. The thinning of the semiconductor substrate 100 may include performing a polishing, grinding, or etching process on the second surface 100b of the semiconductor substrate 100. The polishing process may include a chemical mechanical polishing (CMP) process. The carrier substrate 200 may support the semiconductor substrate 100 during its thinning. The thinning of the semiconductor substrate 100 may expose the through vias 120 at the second surface 100b of the semiconductor substrate 100. A plurality of conductive pads 160 may be formed on the second surface 100b of the semiconductor substrate 100 to come into connection with corresponding through vias 120. The thinned semiconductor substrate 100 may be easily handled by the carrier substrate 200.

Figure 14:
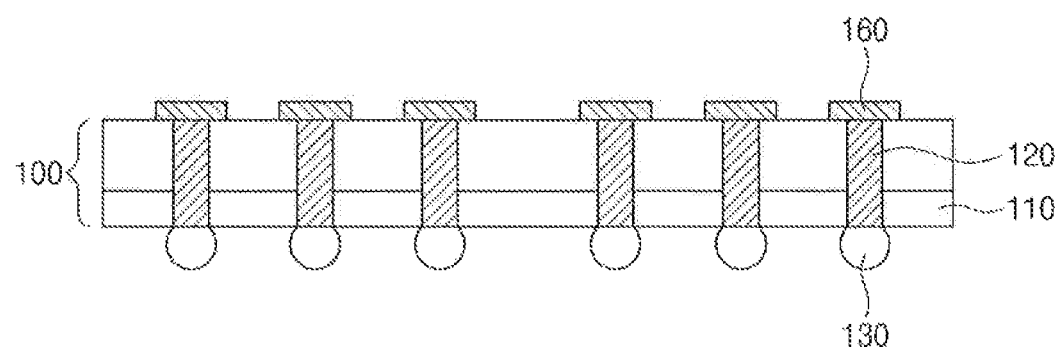

Referring to FIG. 14, the carrier substrate 200 may be removed. A physical method may be used to remove the carrier substrate 200. The adhesive layer 150 and the release layer 140 may be removed after the carrier substrate 200 is removed. A physical method may be used to remove the adhesive layer 150 and the release layer 140. For example, a rolling tape may be provided on a surface of the adhesive layer 150 from which the carrier substrate 200 is removed. The rolling tape may be adhered to the adhesive layer 150. An adhesion may be greater between the adhesive layer 150 and the rolling tape than between the release layer 140 and the semiconductor substrate 100. When the rolling tape moves in a horizontal direction, the adhesive layer 150 and the release layer 140 may accordingly be separated from the semiconductor substrate 100.

Figure 15:
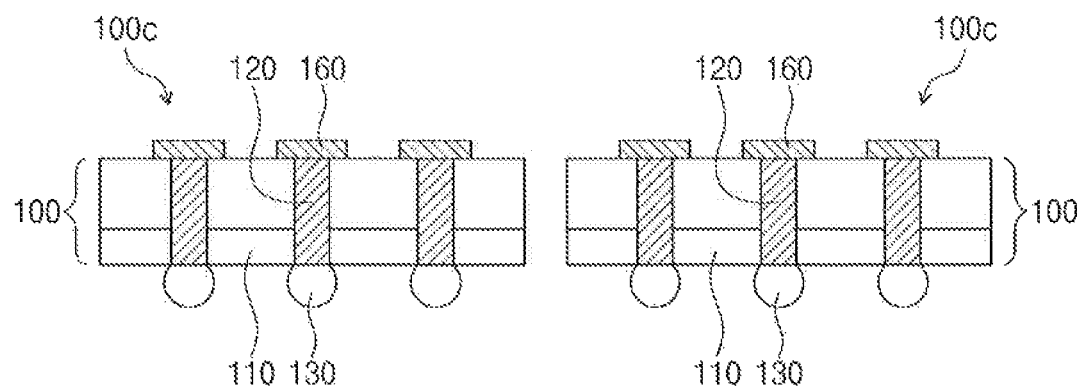

Referring to FIG. 15, the semiconductor substrate 100 may be diced and separated into a plurality of semiconductor chips 100c. The dicing process may be performed along a scribe lane (not shown) on the semiconductor substrate 100.

Figure 16:
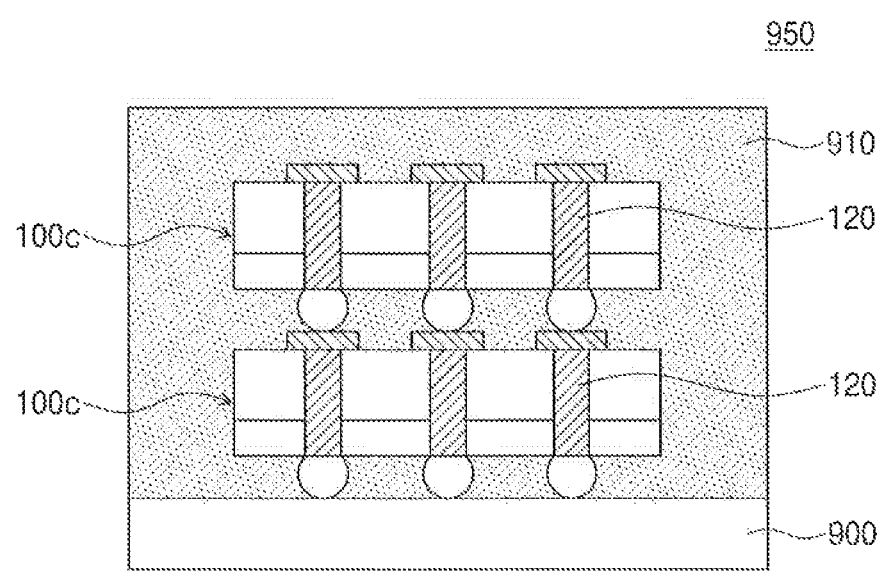

Referring now to FIG. 16, at least one semiconductor chip 100c may be mounted on an upper surface of a printed circuit board 900. When a plurality of semiconductor chips 100c are mounted on the upper surface of the printed circuit board 900, the semiconductor chips 100c may be flip-chip bonded. The through vias 120 may be provided as paths of electrical signals communicated between the printed circuit board 900 and the semiconductor chips 100c and/or between the semiconductor chips 100c. A molding layer 910 may be provided on the upper surface of the printed circuit board 900, encapsulating the semiconductor chips 100c. The molding layer 910 may include an insulating material, such as an epoxy molding compound (EMC). Although not shown, one or more external terminals such as solder balls may further be formed on a bottom surface of the printed circuit board 900. As a result, a semiconductor device 950 may be fabricated.

According to embodiments of the inventive concept, the semiconductor packaging apparatus 1000 may include the detection part 30 provided in the cooling part 550 of the process unit 500 and also include the controller 560 being connected to the detection part 30. The detection part 30 and the controller 560 may be configured to detect a defect of the bonded substrate 300 (e.g., misalignment between the semiconductor substrate 100 and the carrier substrate 200) during the cooling of the bonded substrate 300. All of bonded substrates 300 formed in the process unit 500 may experience the cooling process executed in the cooling part 550. The defect detection for the bonded substrate 300 may be performed simultaneously with the cooling process such that it may be easy to real-time detect the defect of each of the bonded substrates 300.

In addition, the controller 560 may be configured to control the process unit 500, based on the detected data (e.g., data about misalignment between the semiconductor substrate 100 and the carrier substrate 200). In other words based on the misalignment data, the controller 560 may control the process unit so that, for example, the placement of the carrier substrate on the adhesive of the semiconductor substrate may be compensated for based on the misalignment data. Thus, the controller can provide a type of feedback that controls the process unit 500 and indicate to an external control to adjust the bonding operation based on the misalignment data. Therefore, the defect may minimally or rarely occur in a subsequent bonded substrate 300.

Accordingly, embodiments of the inventive concept may provide a semiconductor packaging apparatus having a function to real-time detect defects of bonded substrates, and to provide a semiconductor device manufacturing method capable of minimizing or reducing the occurrence of defects in the bonded substrates.

The aforementioned description provides embodiments of the inventive concept provided for illustrative purposes. Therefore, the embodiments of the inventive concept are not limited to the descriptions herein above, and it will be understood by a person of ordinary skill in the art that variations in form and detail may be made therein without departing from the spirit and scope of the aforementioned description.

What is claimed is:

1. A method of manufacturing a semiconductor device, the method comprising:
   forming a bonded substrate by bonding a carrier substrate to a semiconductor substrate in a bonding part of a semiconductor packaging apparatus;
   performing a cooling process that cools the bonded substrate; and
   detecting, by a detection part of the semiconductor packaging apparatus, a defect of the bonded substrate during the cooling process,
   wherein detecting the defect of the bonded substrate comprises detecting by the detection part of the semiconductor packaging apparatus, misalignment between the semiconductor substrate and the carrier substrate,
   wherein detecting the misalignment comprises obtaining edge images of an upper surface of the bonded substrate,
   wherein detecting the misalignment by the detection part of the semiconductor packaging apparatus comprises obtaining a degree of the misalignment between the semiconductor substrate and the carrier substrate using the edge images,
   wherein obtaining the degree of the misalignment comprises:
   yielding edge offset values from the edge images, wherein each of the edge offset values corresponds to a respective degree that an edge of the carrier substrate is offset from an edge of the semiconductor substrate.

2. The method of claim 1,
   wherein the edge images comprise corresponding edge points of the upper surface of the bonded substrate.

3. The method of claim 2, wherein, when viewed in plan, the corresponding edge points correspond to vertices of an imaginary regular triangle provided on the upper surface of the bonded substrate in which three of the corresponding edge points are measured to obtain respective edge offset values.

4. The method of claim 1, wherein obtaining the degree of the misalignment further comprises:
   obtaining a central offset value using the edge offset values,
   wherein the central offset value corresponds to a degree of misalignment that a center of the carrier substrate is offset from a center of the semiconductor substrate,
   the central offset value being determined as the degree of the misalignment.

5. The method of claim 1, further comprising activating an alarm when a degree of the misalignment between the semiconductor substrate and the carrier substrate is outside of an allowable range.

6. The method of claim 1, before forming the bonded substrate, further comprising forming an adhesive layer on the semiconductor substrate,
   wherein the semiconductor substrate comprises through vias penetrating an inside of the semiconductor substrate, and
   wherein the bonded substrate is formed by bonding the carrier substrate to the semiconductor substrate through the adhesive layer.

7. The method of claim 6, wherein prior to performing the cooling process, further comprising heating the bonded substrate.

8. The method of claim 6, wherein prior to forming the bonded substrate, further comprising forming a release layer on the semiconductor substrate,
   wherein the release layer is formed to interpose between the semiconductor substrate and the adhesive layer, and
   wherein the bonded substrate is formed when the carrier substrate is bonded through the release
   layer and the adhesive layer to the semiconductor substrate.

* * * * *